US012686614B2

(12) United States Patent
Dan et al.

(10) Patent No.: US 12,686,614 B2
(45) Date of Patent: Jul. 21, 2026

(54) MEMS LOUDSPEAKER MANUFACTURING METHOD AND MEMS LOUDSPEAKER

(71) Applicant: AAC Kaitai Technologies (Wuhan) CO., LTD., Wuhan (CN)

(72) Inventors: Qiang Dan, Wuhan (CN); Rui Cai, Wuhan (CN); Yiwei Zhou, Wuhan (CN); Yu Shen, Wuhan (CN); Yang Li, Wuhan (CN)

(73) Assignee: AAC Kaitai Technologies (Wuhan) CO., LTD., Wuhan (CN)

( * ) Notice: Subject to any disclaimer, the term of this patent is extended or adjusted under 35 U.S.C. 154(b) by 392 days.

(21) Appl. No.: 18/454,774

(22) Filed: Aug. 23, 2023

(65) Prior Publication Data

US 2024/0174513 A1    May 30, 2024

Related U.S. Application Data

(63) Continuation of application No. PCT/CN2023/087082, filed on Apr. 7, 2023.

(30) Foreign Application Priority Data

Nov. 29, 2022    (CN) .......................... 202211510270.8

(51) Int. Cl.
*B81C 1/00* (2006.01)
*B81B 7/00* (2006.01)
*H04R 19/02* (2006.01)

(52) U.S. Cl.
CPC .......... *B81C 1/00158* (2013.01); *B81B 7/008* (2013.01); *H04R 19/02* (2013.01);
(Continued)

(58) Field of Classification Search
CPC ........ B81C 1/00158; B81C 2203/0792; B81B 7/008; B81B 2201/0257; H04R 19/02;
(Continued)

(56) References Cited

U.S. PATENT DOCUMENTS 9,271,087 B1 * 2/2016 Hsieh .................... H04R 19/005
2004/0008334 A1 * 1/2004 Sreenivasan .......... G03F 7/0002
355/75
(Continued)

FOREIGN PATENT DOCUMENTS

CN 104735596 A * 6/2015
CN 204761710 U * 11/2015
KR 101333573 B1 * 11/2013 ............. H04R 19/04

OTHER PUBLICATIONS

English machine translation of CN-104735596-A (Jing, Fei; Silicon microphone packaging structure and preparation method thereof ; published Jun. 2015) (Year: 2015).*
(Continued)

*Primary Examiner* — Mark Fischer
(74) *Attorney, Agent, or Firm* — Wiersch Law Group

(57) ABSTRACT

A MEMS loudspeaker manufacturing method and a MEMS loudspeaker are provided. The MEMS loudspeaker manufacturing method includes positioning a printed circuit board (PCB) substrate, inverting a MEMS chip and electrically connecting the PCB substrate to a first side of the PCB substrate having a first groove. filling and solidifying a polymer protection material in the gap between the MEMS chip and the PCB substrate, and combining the MEMS chip and the PCB substrate into a combination component. Since the PCB substrate and the MEMS chip are combined into the combination component through using the polymer protection component made of the polymer protection material, and the polymer protection component is coated with the conducting component, an overall packaging size of the MEMS loudspeaker basically is enabled to be consistent with a size of the MEMS chip, and sensitivity parameters of the MEMS loudspeaker may be significantly improved.

9 Claims, 7 Drawing Sheets

(52) U.S. Cl.
CPC ................. *B81B 2201/0257* (2013.01); *B81C 2203/0792* (2013.01); *H04R 2201/003* (2013.01)

(58) Field of Classification Search
CPC .............. H04R 2201/003; H04R 1/021; H04R 2400/00; H04R 31/00
See application file for complete search history.

(56) References Cited

U.S. PATENT DOCUMENTS

| | | | | |
|---|---|---|---|---|
| 2016/0014530 A1* | 1/2016 | Gao | ....................... | H04R 19/04 |
| | | | | 438/51 |
| 2017/0332176 A1* | 11/2017 | Pantel | ................... | B81B 7/0061 |
| 2020/0169818 A1* | 5/2020 | Rombach | ............... | H04R 1/086 |
| 2021/0092500 A1* | 3/2021 | Lo | ........................ | H04R 19/005 |
| 2025/0070005 A1* | 2/2025 | Oggioni | ................ | H05K 1/185 |

OTHER PUBLICATIONS

English machine translation of CN-204761710-U (Xie et al,; MEMS microphone; published Nov. 2015) (Year: 2015).*

\* cited by examiner

MEMS LOUDSPEAKER MANUFACTURING METHOD AND MEMS LOUDSPEAKER

TECHNICAL FIELD

The present disclosure relates to a technical field of sound devices, in particular to a MEMS loudspeaker manufacturing method and a MEMS loudspeaker.

BACKGROUND

Speakers are a device for converting electrical signals into sound signals, which are widely applied in mobile phones, computers and other mobile terminals.

Compared with conventional voice coil loudspeakers, Micro-Electro-Mechanical System (MEMS) loudspeakers have advantages of good consistency, low power consumption, small size, and low price. In related technologies, the MEMS loudspeakers each includes a circuit board, a shell, and a MEMS speaker chip, the shell is covered with and connected to the circuit board to form an accommodating space, and the MEMS loudspeaker chip is placed in the accommodating space and bonded with the circuit board through a lead.

However, sensitive parameters (SPL/unit package plane area) of the MEMS loudspeakers in related technologies are not high, which is not conducive to the application of products in narrow space and strict power consumption.

SUMMARY

The present disclosure aims to provide a MEMS loudspeaker manufacturing method and a MEMS loudspeaker, which may improve sensitive parameters of the MEMS loudspeaker, so as to be suitable for applying in narrow space and strict power consumption.

The technical solutions of the present disclosure are as follows.

A MEMS loudspeaker manufacturing method includes following steps:

positioning a printed circuit board (PCB) substrate, where the PCB substrate defines a first groove located on a first side of the PCB substrate and an acoustic hole passed through a second side of the PCB substrate and communicated with the first groove;

inverting a MEMS chip and electrically connecting the PCB substrate to the first side of the PCB substrate having the first groove, where a projection of a vibrating diaphragm of the MEMS chip in a thickness direction falls into the first groove, and a gap is defined between the MEMS chip and the PCB substrate; and filling and solidifying a polymer protection material in the gap between the MEMS chip and the PCB substrate, and combining the MEMS chip and the PCB substrate into a combination component.

Furthermore, the positioning a PCB substrate further includes adjusting a posture of the PCB substrate to keep the PCB substrate horizontal and the first groove facing upwards.

Furthermore, after positioning the PCB substrate, the method further includes: pasting a first mesh on the PCB substrate so that the first mesh covers the acoustic hole.

Furthermore, the inverting the MEMS chip and electrically connecting the PCB substrate to the first side of the PCB substrate having the first groove, further includes dot coating a conductive material on a plurality of solder pads at a top side of the PCB substrate; adjusting a posture of the MEMS chip, inverting the MEMS chip and aligning the MEMS chip with the PCB substrate, and stacking the MEMS chip on the PCB substrate; and solidifying the conductive material and forming a conducting component electrically connected between the MEMS chip and the PCB substrate.

Furthermore, the filling and solidifying the polymer protection material in the gap between the MEMS chip and the PCB substrate, further includes disposing a sealing fixture on a peripheral side of the MEMS chip and a peripheral side of the PCB substrate, where a glue filling opening is formed between the peripheral side of the MEMS chip and an inner side of the sealing fixture, and the glue filling opening communicates with the gap; dot coating a liquid polymer protection material to the glue filling opening until the gap and the glue filling opening are filled; solidifying the liquid polymer protection material, and forming a polymer protection component within the gap and the peripheral side of the MEMS chip.

Furthermore, a height of the gap is between 1 um and 300 um.

Furthermore, one side of the MEMS chip away from the PCB substrate defines a second groove located on the one side of the vibrating diaphragm, where before or after filling and solidifying a polymer protection material in the gap between the MEMS chip and the PCB substrate, further includes pasting a second mesh covering an opening of the second groove on the side of the MEMS chip away from the PCB substrate.

Furthermore, the PCB substrate defines the first groove including at least two first grooves, where after filling and solidifying the polymer protection material in the gap between the MEMS chip and the PCB substrate, further includes cutting the combination component combined by the MEMS chip and the PCB substrate to form at least two loudspeaker units along a preset cutting track, where the preset cutting track is located between two adjacent first grooves.

Furthermore, the present disclosure provides a MEMS loudspeaker, the MEMS loudspeaker is manufactured by the above MEMS loudspeaker manufacturing method. The MEMS loudspeaker includes the PCB substrate, the MEMS chip located on the first side of the PCB substrate, the conducting component electrically connected between the PCB substrate and the MEMS chip, and the polymer protection component bonded between the PCB substrate and the MEMS chip and coated with the conducting component. The PCB substrate and the MEMS chip are enclosed to form a first sound cavity, and the second side of the PCB substrate away from the MEMS chip defines the acoustic hole communicating with the first sound cavity.

Furthermore, the MEMS loudspeaker further includes a first mesh attached to the PCB substrate and covering the acoustic hole, and a second mesh attached to one side of the MEMS chip away from the PCB substrate and enclosed with the MEMS chip to form a second sound cavity.

The beneficial effects of the present disclosure are as following.

In the present disclosure, since the use of the polymer protection component between the PCB substrate and the MEMS chip, the PCB substrate and the MEMS chip are combined to be a whole, and the polymer protection component is coated with the conducting component, which may ensure that an overall packaging size of the MEMS speaker is basically the same as a size of the MEMS chip (a chip size/a packaging size may be greater than or equal to 95%, if the chip size is Φ4.8 mm, the packaging size may only be Φ5 mm or even smaller). Therefore, the sensitivity parameters of the MEMS loudspeaker may be significantly improved, the sensitivity parameters are SPL/unit packaging plane areas, and the conducting component is sealed without contact with external air, which results in higher reliability, so as to be suitable for applying in the narrow space and the strict power consumption.

DETAILED DESCRIPTION

The following is a further explanation of the present disclosure in conjunction with the accompanying drawings and implementation methods.

Figure 1:
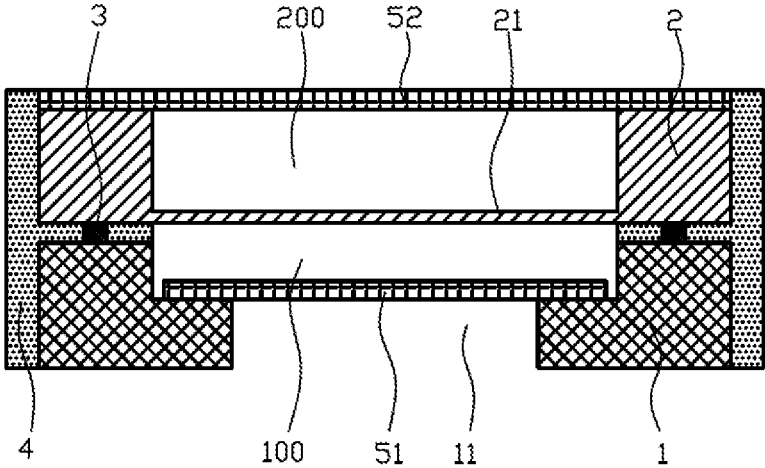
FIG. 1 is a structural schematic diagram of a MEMS loudspeaker according to a first implementation method of the present disclosure.
Figure 2:
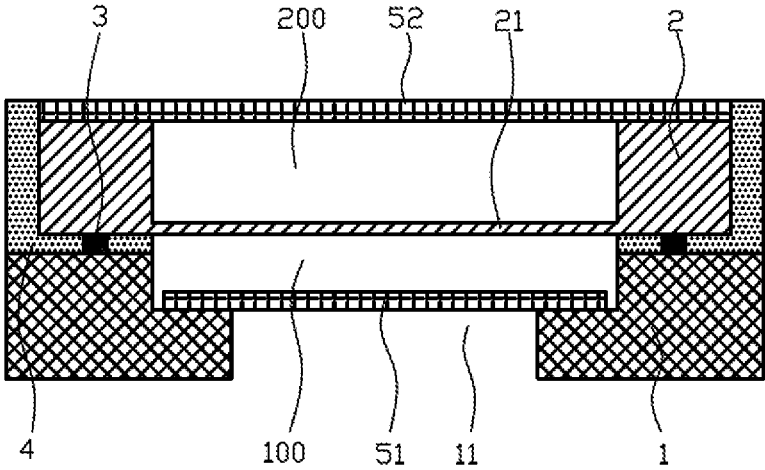
FIG. 2 is a structural schematic diagram of a MEMS loudspeaker according to a second implementation method of the present disclosure.
Figure 3:
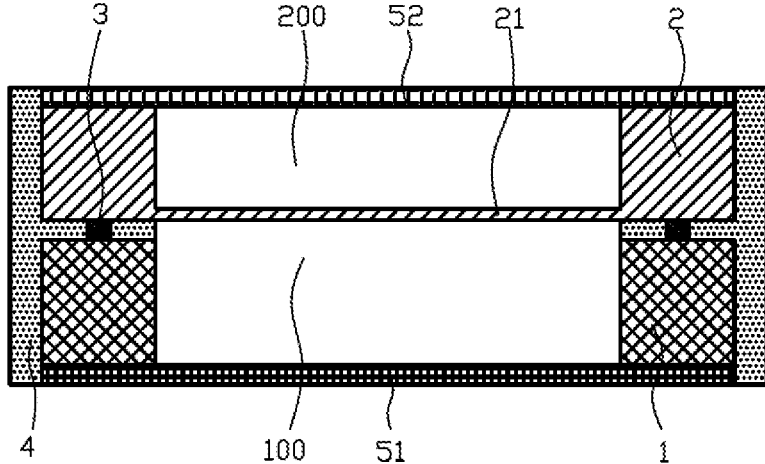
FIG. 3 is a structural schematic diagram of a MEMS loudspeaker according to a third implementation method of the present disclosure.
Figure 4:
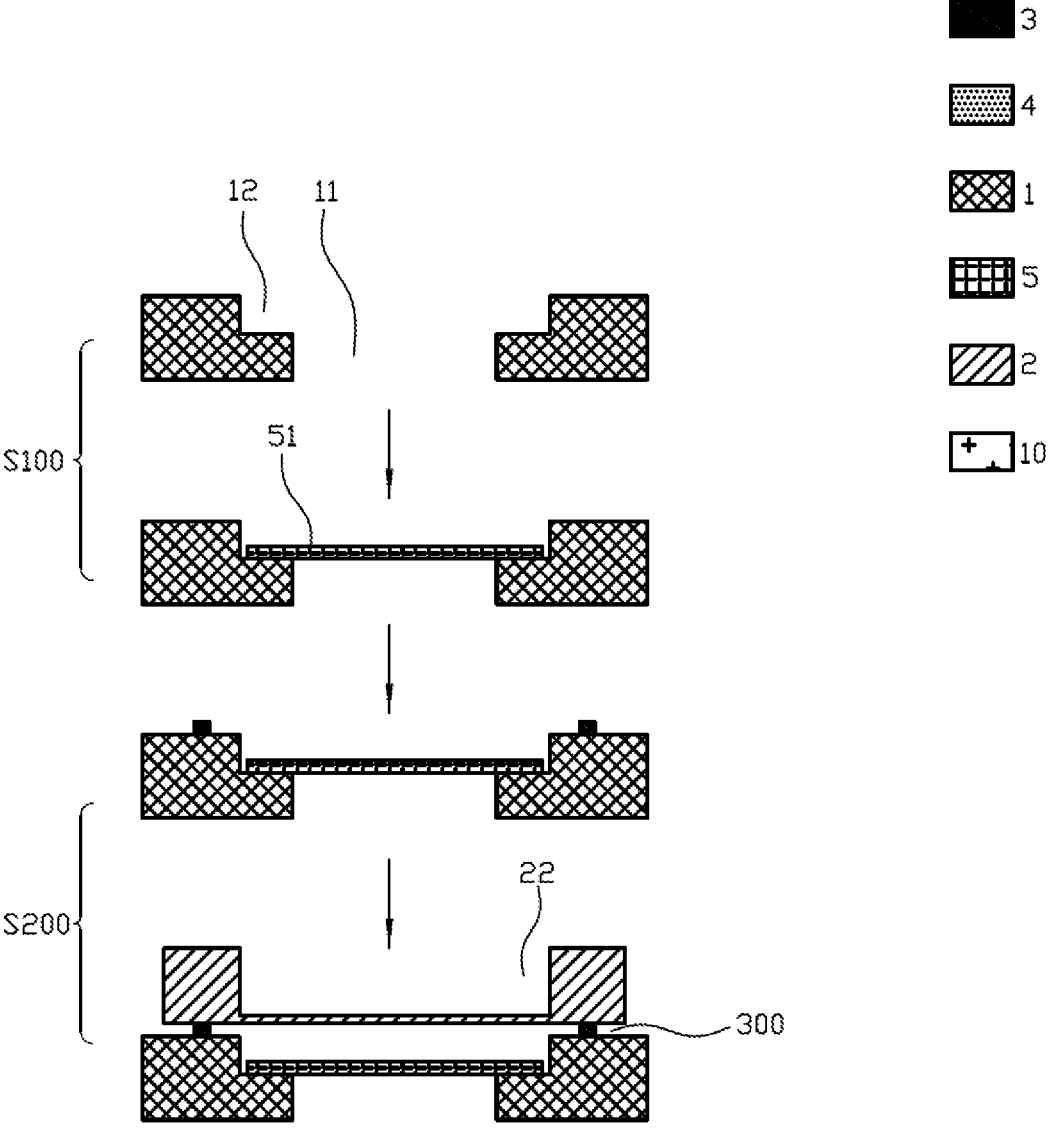
FIG. 4 is a flowchart of steps S100 and S200 in a MEMS loudspeaker manufacturing method according to one embodiment of the present disclosure.

Referring to FIGS. 1 to 3, the present disclosure provides a MEMS loudspeaker, the MEMS loudspeaker includes a printed circuit board (PCB) substrate 1, a MEMS chip 2 located on one side of the PCB substrate 1, a conducting component 3 electrically connected between the PCB substrate 1 and the MEMS chip 2, and a polymer protection component 4 bonded between the PCB substrate 1 and the MEMS chip 2 and coated with the conducting component 3. The PCB substrate 1 and the MEMS chip 2 are enclosed to form a first sound cavity 100, one side of the PCB substrate 1 away from the MEMS chip 2 defines an acoustic hole 11, and the acoustic hole 11 communicates with the first sound cavity 100.

In the present disclosure, since the use of the polymer protection component 4 between the PCB substrate 1 and the MEMS chip 2, the PCB substrate 1 and the MEMS chip 2 are combined to be a whole, and the polymer protection component 4 is coated with the conducting component 3, which may ensure that an overall packaging size of the MEMS speaker is basically the same as a size of the MEMS chip 2 (a chip size/a packaging size may be greater than or equal to 95%, if the chip size is Φ4.8 mm, the packaging size may only be Φ5 mm or even smaller). Therefore, the sensitivity parameters of the MEMS loudspeaker may be significantly improved, the sensitivity parameters are SPL/unit packaging plane areas, and the conducting component 3 is sealed without contact with external air, which results in higher reliability, so as to be suitable for applying in the narrow space and the strict power consumption.

Furthermore, the MEMS loudspeaker further includes a first mesh 51 attached to the PCB substrate 1 and covering the acoustic hole 11 and a second mesh 52 attached to one side of the MEMS chip 2 away from the PCB substrate 1 and enclosed with the MEMS chip 2 to form a second sound cavity 200.

Specifically, the first mesh 51 and the second mesh 52 may be made of a porous mesh material 5, such as damping mesh or metal porous mesh, on the one hand, better total harmonic distortion (THD) performance is achieved, and on the other hand, dust is prevented from entering the first sound cavity 100 and the second sound cavity 200 and directly contacting the MEMS chip 2, thereby resulting in better reliability. Referring to FIG. 1 and FIG. 2, the first mesh 51 may be attached to one side of the PCB substrate 1 facing the first sound cavity 100, and the first mesh 51 is located inside the first sound cavity 100. Referring to FIG. 3, the first mesh 51 may be attached to one side of the PCB board 1 away from the MEMS chip 2, the acoustic hole 11 may be an opening of the first sound cavity 100, and the first mesh 51 directly covers the opening of the first sound cavity 100.

Furthermore, the MEMS chip 2 has a vibrating diaphragm 21 located between the first sound cavity 100 and the second sound cavity 200, and a projection of the vibrating diaphragm 21 in a thickness direction falls into a projection of the first sound cavity 100. Therefore, during a vibration of the vibrating diaphragm 21, the vibrating diaphragm 21 is not affected by a sidewall of the first sound cavity 100, thereby resulting in better acoustic performance.

Furthermore, the polymer protection component 4 is covered on an outer side of the MEMS chip 2 and the PCB substrate 1, thereby isolating the MEMS chip 2 from the external air and improving the reliability of the MEMS loudspeaker. Preferably, the polymer protection component 4 may cover an outer side of the second mesh 52, a peripheral surface of the MEMS chip 2 is not in direct contact with the external air, therefore, it is not easy to contact with impurities such as dust in the air, which ensures the reliability of the MEMS chip 2. When the first mesh 51 is attached to one side of the PCB substrate 1 away from the MEMS chip 2, the polymer protection component 4 may also be disposed to simultaneously cover an outer side of the first mesh 51, thereby further improving the reliability of the MEMS loudspeaker.

In some embodiments, the polymer protection component 4 may be covered on the outer side of MEMS chip 2 without covering the outer side of the PCB substrate 1, an outer surface of the polymer protection component 4 is flush with an outer surface of the PCB substrate 1, which may reduce the amount of the polymer protection material used and reduce costs.

Furthermore, referring to FIGS. 4 to 7, the present disclosure further provides a MEMS speaker manufacturing method for manufacturing the MEMS loudspeaker, and the MEMS loudspeaker manufacturing method includes the following steps.

At step S100, positioning a PCB substrate 1, the PCB substrate 1 defines a first groove 12 located on one side of the PCB substrate 1 and an acoustic hole 11 that passes through another side of the PCB substrate 1 and is communicated to the first groove 12.

It may be understood that a posture of PCB substrate 1 may be adjusted to keep the PCB substrate 1 horizontal and the first groove 12 facing upwards. Specifically, when positioning the PCB substrate 1, a positioning fixture may be used, and a positioning groove may be disposed on a top side of the positioning fixture, the PCB substrate 1 is placed in the positioning groove of the positioning fixture through manual or an automated device, so that the PCB substrate 1 remains horizontal and the first groove 12 faces upwards.

When the first mesh 51 is disposed inside the first sound cavity 100, after the PCB substrate 1 is positioned, the first mesh 51 may be pasted on a bottom side of the first groove 12 and covered with the acoustic hole 11, in this way, when connecting the MEMS chip 2 to the PCB substrate 1 in the future, the first mesh 51 is located inside the first sound cavity 100.

When the first mesh 51 is disposed outside the first sound cavity 100, the first mesh 51 may be pasted on the side of the PCB substrate 1 away from the first groove 12 and covered with the acoustic hole 11 before positioning the PCB substrate 1. In some embodiments, the first mesh 51 and the PCB substrate 1 may also be pasted and fixed at a last moment.

At step S200, inverting the MEMS chip 2 and electrically connecting the MEMS chip 2 to one side of the PCB substrate 1 having the first groove 12. A projection of the vibrating diaphragm 21 of the MEMS chip 2 in the thickness direction falls into the first groove 12, and there is a gap 300 between the MEMS chip 2 and the PCB substrate 1.

Specifically, in this step, the conductive material may be dot coated on a plurality of solder pads at a top side of the PCB substrate 1, and the conductive material may be silver glue, tin paste and other solid-liquid mixed material.

The posture of the MEMS chip 2 is adjusted, so that the MEMS chip 2 is inverted and aligned with the PCB substrate 1, and stacking the MEMS chip 2 on the PCB substrate 1 so that the contact points of the MEMS chip 2 are contacted with the conductive material. The gap 300 is formed between the MEMS chip 2 and the PCB substrate 1, and a height of the gap is between 1 um and 300 um, so that the polymer protection material may flow into and fill the gap 300 later.

The conductive material is solidified to form a conducting component 3 electrically connected between the MEMS chip 2 and the PCB substrate 1. The method to solidify the conductive material may be done by reflow welding or hot pressing welding. Therefore, the conducting component 3 may fix and electrically connect the MEMS chip 2 and the PCB substrate 1 to maintain the connection stability of the MEMS chip 2 and the PCB substrate 1.

At step S300, filling and solidifying the polymer protection material in the gap 300 between the MEMS chip 2 and the PCB substrate 1 so that the MEMS chip 2 and the PCB substrate 1 are combined as a combination component.

Figure 5:
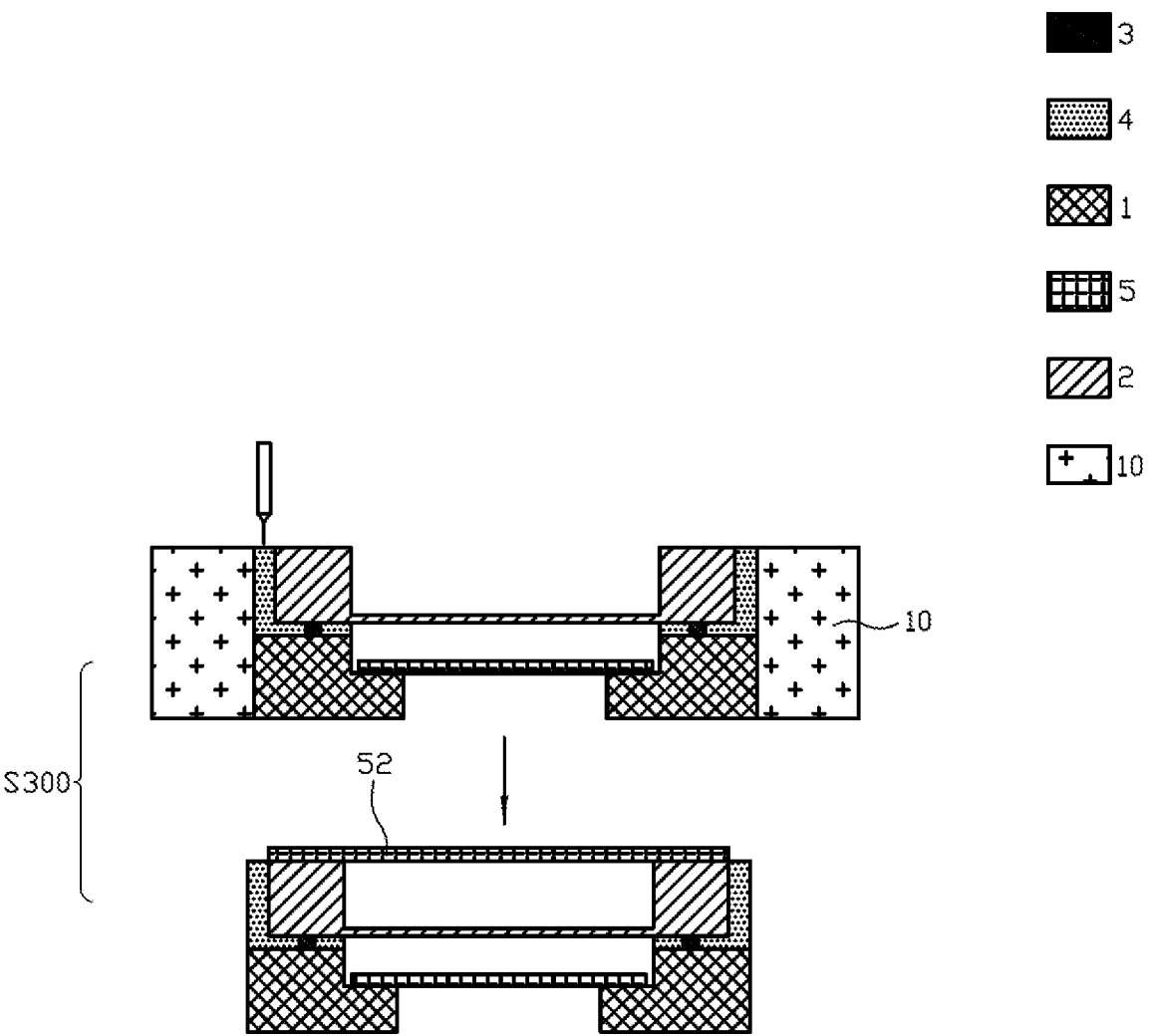
FIG. 5 is a flowchart of step S300 in the MEMS loudspeaker manufacturing method according to a first implementation method of the present disclosure.
Figure 6:
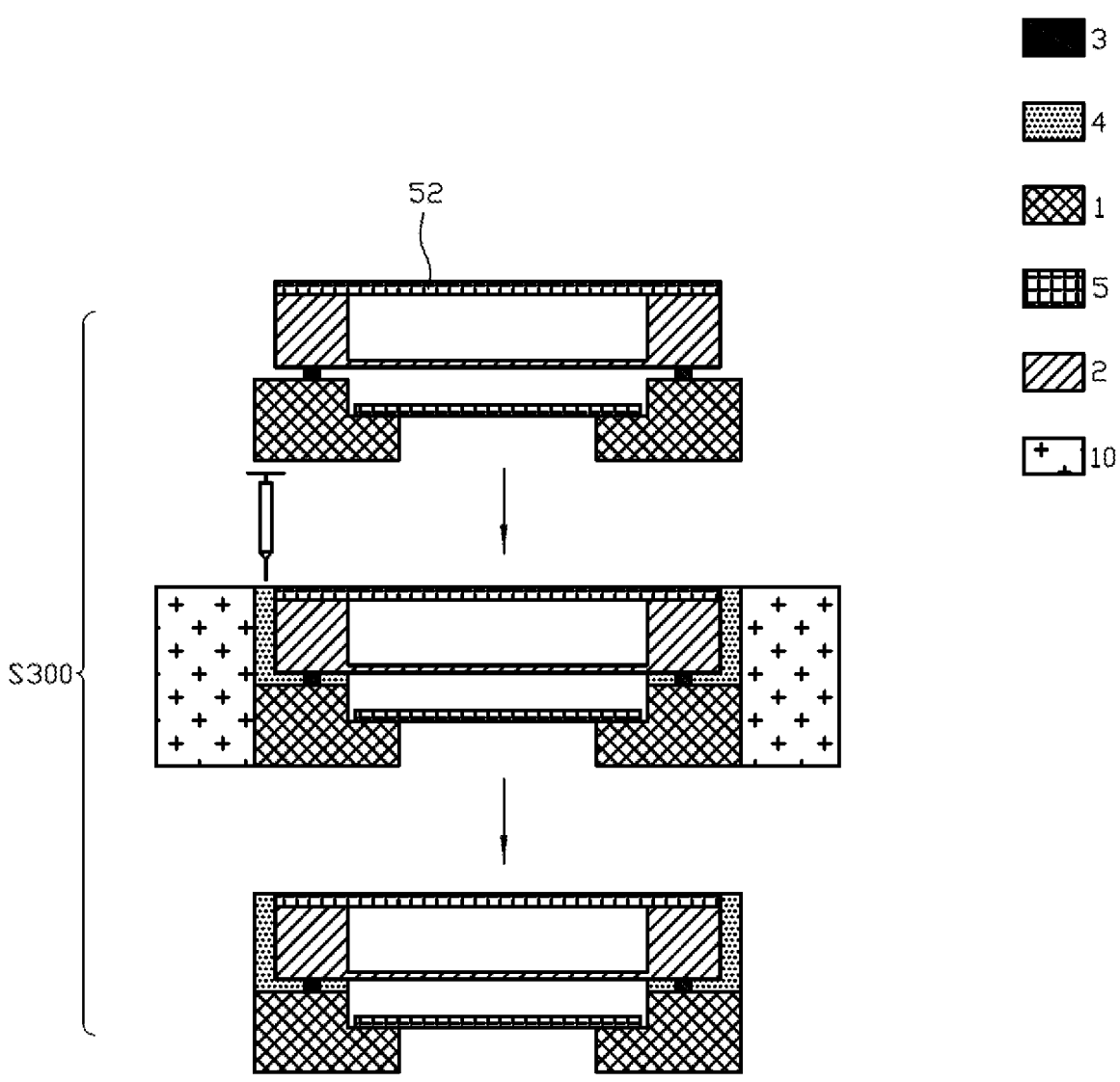
FIG. 6 is a flowchart of step S300 in the MEMS loudspeaker manufacturing method according to a second implementation method of the present disclosure.

Referring to FIG. 5 and FIG. 6, in this step, a sealing fixture 10 may be disposed on a peripheral side of the MEMS chip 2 and a peripheral side of the PCB substrate 1, the peripheral side of the MEMS chip 2 and an inner side of the sealing fixture 10 form a glue filling opening, and the glue filling opening communicates with the gap 300. If it is necessary to cover an outer side of the PCB substrate 1 with the polymer protection component 4, the glue filling opening shall be extended in the thickness direction to be flush with the bottom side of the PCB substrate 1. The side of the MEMS chip 2 away from the PCB substrate 1 has a second groove 22 located on the side of the vibrating diaphragm 21. If it is necessary to cover the outer side of the second mesh 52 with the polymer protection component 4, before filling and solidifying the polymer protection material in the gap 300 between the MEMS chip 2 and the PCB substrate 1, the method further includes pasting the second mesh 52 covering an opening of the second groove 22 on one side of the MEMS chip 2 away from the PCB substrate 1. The peripheral side of the MEMS chip 2, the peripheral side of the second mesh 52, and the inner side of the sealing fixture 10 form a glue filling opening communicating with the gap 300. If the outside of the second mesh 52 does not need to be covered with the polymer protection component 4, after filling and solidifying the polymer protection material in the gap 300 between the MEMS chip 2 and the PCB substrate 1, the method further includes pasting the second mesh 52 covering an opening of the second groove 22 on the one side of the MEMS chip 2 away from the PCB substrate 1.

The liquid polymer protection material is dot coated to the glue filling opening until the gap 300 and glue filling opening are filled. The polymer protection material may be polyethylene terephthalate, polycarbonate, polyallylate film and other plastic insulating materials. In the present disclosure, a projection of the vibrating diaphragm 21 of the MEMS chip 2 in the thickness direction falls into the first groove 12, the side wall of the first groove 12 is flush with the edge of the vibrating diaphragm 21 or is located outside the edge of the vibrating diaphragm 21. Therefore, when filling the polymer protection material, the polymer protection material may not flow to the vibrating diaphragm 21 to affect the acoustic performance, so that higher reliability is achieved. In some embodiments, the side of the MEMS chip 2 close to the PCB substrate 1 or the side of the PCB substrate close to the MEMS chip 2 may be provided with a limiting edge around the first groove 12. The limiting edge seals the side of the gap towards the first groove 12, thereby blocking the polymer protection material flow to the vibrating diaphragm 21, when filling the polymer protection material, the polymer protection material may not flow to the vibrating diaphragm 21 to affect the acoustic performance, so as to ensure the acoustic performance of the loudspeaker.

The polymer protection material is solidified to form a polymer protection component 4 in the gap 300 and the peripheral of the MEMS chip 2, and the MEMS speaker is demolded from the sealing fixture 10. On the one hand, the polymer protection component 4 may bind the MEMS chip 2 and the PCB substrate 1 closely, on the other hand, the polymer protection component 4 may cover the outer side of the conducting component 3 and the MEMS chip 2, which may significantly improve the sensitive parameters of the MEMS loudspeaker under a condition of realizing the reliable packaging of the MEMS chip 2.

Furthermore, in order to improve the production efficiency of the MEMS loudspeaker, a method of a batch production may be applied, and the PCB substrate 1 is provided with at least two first grooves 12, each of the at least two first grooves 12 is preferably arranged in a rectangular array, and a plurality of MEMS loudspeaker units may be synchronously formed on a PCB substrate 1.

Figure 7:
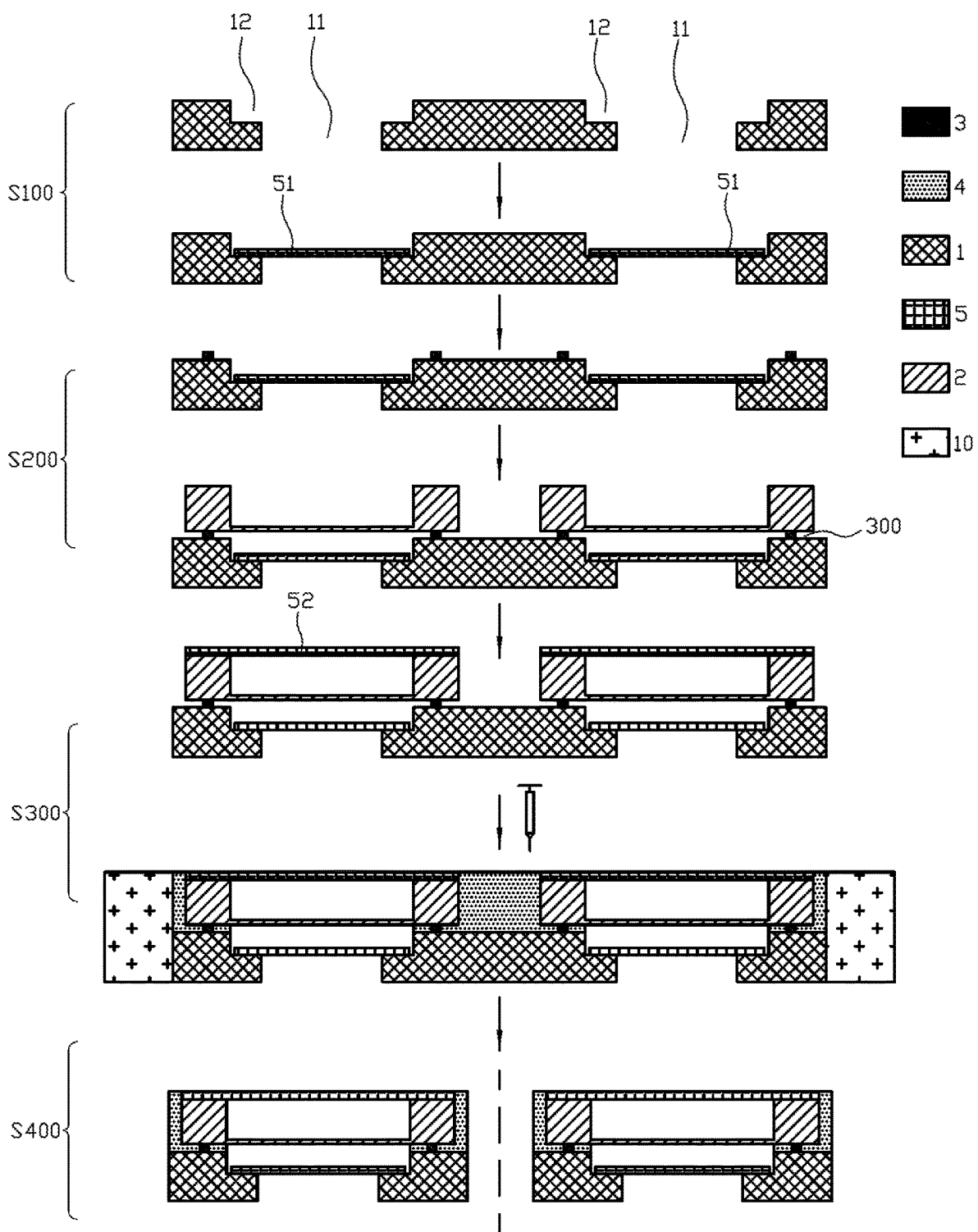
FIG. 7 is a flowchart of a MEMS loudspeaker manufacturing method according to another embodiment of the present disclosure.

Referring to FIG. 7, in the method of the batch production, in the step S100, a whole PCB substrate 1 is horizontally positioned, and the first groove 12 is faced upwards. In the step S200, the MEMS chips 2 may be flip weld and fixed at the corresponding positions of the PCB substrate 1 and the first groove 12, respectively. In the step S300, the whole PCB substrate 1 assembled with the MEMS chip 2 is placed in the sealing fixture 10, therefore, the glue filling opening formed between the outer side of the MEMS chip 2 and the inner side of the sealing fixture 10 is communicated with the glue filling opening formed between adjacent MEMS chips 2, and the glue filling opening is communicated with the gap 300 between the MEMS chip 2 and the PCB substrate 1. Therefore, all MEMS chips 2 may be firmly bonded to the PCB substrate 1 by dot coating the liquid polymer protection material to the glue filling opening. It should be understood that in the batch production, the specific process flow of each of the plurality of the MEMS loudspeaker units may be referred to the steps in S100-S300 and may not be described here.

Furthermore, for the batch production process, after filling and solidifying the polymer protection material in the gap 300 between the MEMS chip 2 and the PCB substrate 1, the method further includes the following step.

At step S400, cutting the combination component combined by the MEMS chip 2 and the PCB substrate 1 to form at least two loudspeaker units along a preset cutting track. The cutting method may be laser cutting or mechanical cutting, and the preset cutting track is located between the two adjacent first grooves 12. The manufacturing efficiency of the MEMS loudspeaker may be significantly improved by applying a batch production process that reduces the operation steps of positioning and clamping.

The above description is merely embodiment of the present disclosure, for ordinary technicians in the field, improvements may be made without leaving the idea of creation of the present disclosure, but these are within the scope of protection of the present disclosure.

What is claimed is:

1. A micro-electro-mechanical system (MEMS) loudspeaker manufacturing method, comprising:
    positioning a printed circuit board (PCB) substrate, wherein the PCB substrate defines a first groove located on a first side of the PCB substrate and an acoustic hole passed through a second side of the PCB substrate and communicated with the first groove;
    inverting a MEMS chip and electrically connecting the MEMS chip to the first side of the PCB substrate having the first groove, wherein a projection of a vibrating diaphragm of the MEMS chip in a thickness direction falls into the first groove, and a gap is defined between the MEMS chip and the PCB substrate; and
    filling and solidifying a polymer protection material in the gap between the MEMS chip and the PCB substrate, comprising:
    disposing a sealing fixture on a peripheral side of the MEMS chip and a peripheral side of the PCB substrate, wherein a glue filling opening is formed between the peripheral side of the MEMS chip and an inner side of the sealing fixture, and the glue filling opening communicates with the gap;
    dot coating a liquid polymer protection material to the glue filling opening until the gap and the glue filling opening are filled;
    solidifying the liquid polymer protection material, and forming a polymer protection component within the gap and the peripheral side of the MEMS chip to combine the MEMS chip and the PCB substrate into a combination component.

2. The MEMS loudspeaker manufacturing method according to claim 1, wherein the positioning a PCB substrate further comprises:
    adjusting a posture of the PCB substrate to keep the PCB substrate horizontal and the first groove facing upwards.

3. The MEMS loudspeaker manufacturing method according to claim 1, wherein after positioning the PCB substrate, the method further comprises:

pasting a first mesh on the PCB substrate so that the first mesh covers the acoustic hole.

4. The MEMS loudspeaker manufacturing method according to claim 1, wherein the inverting the MEMS chip and electrically connecting the PCB substrate to the first side of the PCB substrate having the first groove, further comprises:
    dot coating a conductive material on a plurality of solder pads at a top side of the PCB substrate;
    adjusting a posture of the MEMS chip, inverting the MEMS chip and aligning the MEMS chip with the PCB substrate, and stacking the MEMS chip on the PCB substrate; and
    solidifying the conductive material and forming a conducting component electrically connected between the MEMS chip and the PCB substrate.

5. The MEMS loudspeaker manufacturing method according to claim 1, wherein a height of the gap is between 1 um and 300 um.

6. The MEMS loudspeaker manufacturing method according to claim 1, wherein one side of the MEMS chip away from the PCB substrate defines a second groove located on one side of the vibrating diaphragm, wherein before or after filling and solidifying the polymer protection material in the gap between the MEMS chip and the PCB substrate, further comprises:
    pasting a second mesh covering an opening of the second groove on the one side of the MEMS chip away from the PCB substrate.

7. The MEMS loudspeaker manufacturing method according to claim 1, wherein the PCB substrate defines the first groove comprising at least two first grooves, wherein after filling and solidifying the polymer protection material in the gap between the MEMS chip and the PCB substrate, further comprises:
    cutting the combination component combined by the MEMS chip and the PCB substrate to form at least two loudspeaker units along a preset cutting track, wherein the preset cutting track is located between adjacent two of the at least two first grooves.

8. A micro-electro-mechanical system (MEMS) loudspeaker manufactured by a MEMS loudspeaker manufacturing method according to claim 1, and comprising:
    the PCB substrate;
    the MEMS chip located on the first side of the PCB substrate;
    the conducting component electrically connected between the PCB substrate and the MEMS chip; and
    the polymer protection component bonded between the PCB substrate and the MEMS chip and coated with the conducting component;
    wherein the PCB substrate and the MEMS chip are enclosed to form a first sound cavity, and the second side of the PCB substrate away from the MEMS chip defines the acoustic hole communicating with the first sound cavity.

9. The MEMS loudspeaker according to claim 8, wherein the MEMS loudspeaker comprises a first mesh attached to the PCB substrate and covering the acoustic hole, and a second mesh attached to one side of the MEMS chip away from the PCB substrate and enclosed with the MEMS chip to form a second sound cavity.

* * * * *